(12) United States Patent
Peng et al.

(10) Patent No.: US 12,463,605 B2
(45) Date of Patent: Nov. 4, 2025

(54) COMPENSATION CIRCUIT

(71) Applicant: SMARTER MICROELECTRONICS (GUANG ZHOU) CO., LTD., Guangzhou (CN)

(72) Inventors: Zhenfei Peng, Guangzhou (CN); Qiang Su, Guangzhou (CN)

(73) Assignee: SMARTER MICROELECTRONICS (GUANG ZHOU) CO., LTD., Guangzhou (CN)

(*) Notice: Subject to any disclaimer, the term of this patent is extended or adjusted under 35 U.S.C. 154(b) by 609 days.

(21) Appl. No.: 17/929,677

(22) Filed: Sep. 2, 2022

(65) Prior Publication Data
US 2023/0006619 A1    Jan. 5, 2023

Related U.S. Application Data

(63) Continuation of application No. PCT/CN2021/136094, filed on Dec. 7, 2021.

(30) Foreign Application Priority Data

Apr. 14, 2021   (CN) .................. 202110402044.7

(51) Int. Cl.
H03F 3/21        (2006.01)
H03F 1/32        (2006.01)
(52) U.S. Cl.
CPC ............... H03F 3/21 (2013.01); H03F 1/32 (2013.01); H03F 2200/451 (2013.01)
(58) Field of Classification Search
CPC ........ H03F 3/21; H03F 1/32; H03F 2200/451; H03F 2200/18; H03F 1/0272; H03F 1/303; H03F 1/3205; H03F 3/245
(Continued)

(56) References Cited

U.S. PATENT DOCUMENTS 6,650,181 B2 * 11/2003 Shinjo ..................... H03F 1/306
330/285
2002/0171483 A1   11/2002 Shinjo et al.
(Continued)

FOREIGN PATENT DOCUMENTS

CN    109428553 A    3/2019
CN    110690863 A    1/2020
(Continued)

OTHER PUBLICATIONS

International Search Report in Application No. PCT/CN2021/136094, mailed on Feb. 23, 2022.

Primary Examiner — Andrea Lindgren Baltzell
Assistant Examiner — Khiem D Nguyen
(74) Attorney, Agent, or Firm — Syncoda LLC; Feng Ma

(57) ABSTRACT

A compensation circuit includes a power amplifier, a current bias circuit, a power detection circuit and a current control circuit; the power detection circuit is configured to detect the voltage amplitude of the radio frequency input signal of the power amplifier and output a reference current when the voltage amplitude meets a preset condition; the current control circuit is configured to receive a reference current and output a compensation current to the current bias circuit based on the reference current; the current bias circuit is configured to receive the compensation current and generate the direct-current bias current, and output the compensation current and the direct-current bias current to the power amplifier; and the power amplifier is configured to receive the compensation current and the direct-current bias current, and amplify the power of the radio frequency input signal based on the compensation current and the direct-current bias current.

9 Claims, 4 Drawing Sheets

(58) Field of Classification Search
USPC .......................................................... 330/296
See application file for complete search history.

(56) References Cited

U.S. PATENT DOCUMENTS

2016/0190992 A1    6/2016  Ridgers et al.
2020/0014336 A1    1/2020  Choi

FOREIGN PATENT DOCUMENTS

CN    110808721 A    2/2020
CN    112803905 A    5/2021

* cited by examiner

COMPENSATION CIRCUIT

CROSS-REFERENCE TO RELATED APPLICATIONS

This is a continuation of International Application No. PCT/CN2021/136094 filed on Dec. 7, 2021, which claims priority to Chinese Patent Application No. 202110402044.7 filed on Apr. 14, 2021. The disclosures of the above-referenced applications are hereby incorporated by reference in their entirety.

BACKGROUND

With the development of 5G communication, power amplifier (PA) with high bandwidth and high linearity plays an increasingly important role. The nonlinear distortion of PA has become a serious problem in 5G wireless communication system, which affects the linear amplification ability and the signal efficiency of PA.

SUMMARY

The disclosure relates to the field of electronic technical, and in particular to a compensation circuit.

Some embodiments of the disclosure provide a compensation circuit.

The compensation circuit can include a power amplifier, a current bias circuit, a power detection circuit and a current control circuit;

the power detection circuit is connected with the power amplifier and configured to detect the voltage amplitude of the radio frequency input signal of the power amplifier and output a reference current when a voltage amplitude of the radio frequency input signal meets a preset condition;

the current control circuit, connected with the power detection circuit and the current bias circuit, is configured to receive the reference current output by the power detection circuit and output a compensation current to the current bias circuit based on the reference current;

the current bias circuit, connected with the current control circuit and the power amplifier, is configured to receive the compensation current output by the current control circuit and generate a direct-current bias current, and output the compensation current and the direct-current bias current to the power amplifier; and the power amplifier, connected with the current bias circuit, is configured to receive the compensation current and the direct-current bias current, and amplify the power of the radio frequency input signal based on the compensation current and the direct-current bias current.

In some embodiments, the preset condition includes:

the power detection circuit detects that the voltage amplitude of the radio frequency input signal is greater than a saturation voltage of the power amplifier.

In some embodiments, the preset condition further includes:

the power detection circuit detects that the voltage amplitude of the radio frequency input signal is lower than a turn-on voltage of the power amplifier.

In some embodiments, the current control circuit includes a first branch and at least one second branch;

the first branch, connected with an output end of the power detection circuit, is configured to receive the reference current output by the power detection circuit; and the second branch, connected to the first branch and the current bias circuit, is configured to form a current mirror with the first branch to output the compensation current based on the reference current received by the first branch.

In some embodiments, the first branch includes a first transistor;

a source of the first transistor is connected with a first power supply;

a gate of the first transistor is connected with the second branch, and a drain of the first transistor is shorted with the gate of the first transistor; and the drain of the first transistor, connected with the output end of the power detection circuit, is configured to receive the reference current output by the power detection circuit.

In some embodiments, the second branch includes a second transistor and a third transistor;

a source of the second transistor is connected with the first power supply; a gate of the second transistor is connected with the gate of the first transistor; a drain of the second transistor is connected with a source of the third transistor, which is configured to generate the compensation current based on the reference current and output to the third transistor;

a drain of the third transistor, connected with an input end of the current bias circuit, is configured to output the compensation current to the current bias circuit; and a gate of the third transistor is a control terminal, configured to receive a digital signal to control an on-off state of the second branch.

In some embodiments, the current bias circuit includes a current source and a fourth transistor;

the current source is configured to generate the direct-current bias current and output it to the fourth transistor;

a source of the fourth transistor is connected with the drain of the third transistor and the current source;

a gate of the fourth transistor is shorted with the source of the fourth transistor;

a drain of the fourth transistor is connected to the ground; and the fourth transistor is configured to receive the compensation current and the direct-current bias current, and output the compensation current and the direct-current bias current to the power amplifier.

In some embodiments, the current bias circuit further includes a resistor;

an input end of the resistor is connected to the gate of the fourth transistor; and an output end of the resistor is connected to the power amplifier.

In some embodiments, the power amplifier includes a matching circuit; and the matching circuit is connected to the resistor and an input end of the radio frequency input signal.

In some embodiments, the compensation circuit further includes a capacitor;

the capacitor is connected between the input end of the power detection circuit and the input end of the radio frequency input signal.

DETAILED DESCRIPTION

In order to make the objectives, technical solutions and advantages of the embodiments of the disclosure clearer, the specific description of the embodiments of the disclosure will be further provided in detail below with reference to the drawings. The described embodiments should not be taken as limiting to the embodiments of the disclosure, all other embodiments obtained by those ordinarily skilled in the art without paying any creative work belong to the scope of the disclosure.

The embodiments of the disclosure and the features of the embodiments may be arbitrarily combined with each other if there is no conflict. Although the logical order is shown in the flowchart, in some cases the steps shown or described may be performed in a different order from those disclosed herein.

Unless otherwise defined, all technical and scientific terms used herein have the same meaning as commonly understood by those skilled in the art of the disclosure. The terms used herein is for the purpose of describing embodiments of the disclosure only and is not intended to limit the embodiments of the disclosure.

In some implementations, a fixed bias current is usually provided for a power amplifier to alleviate the nonlinear distortion of the power amplifier; however, with the increases of the input signal, the gain of the power amplifier will gradually decrease, and this method cannot adjust the bias current according to the input signal; that is, when the input signal reaches a certain level, the gain will show a compression trend, which leads to a significant deterioration of the linearity of the power amplifier.

In an ideal linear power amplifier, the phase difference between an input signal and an output signal should be zero or a constant, that is, the output signal is from the input signal after amplitude amplification and a certain delay. However, in an actual power amplifier, an output signal and an input signal of a power amplifier show a linear amplification relationship in a small signal region. When the input power increases, the power of the output signal gradually approaches the nonlinear amplification region; due to the influence of nonlinearity, AM-AM distortion and AM-PM distortion will occur. Herein, the AM-AM distortion refers to the amplitude distortion of the output signal and the input signal, for example, when the bias current is constant and the swing of the input signal is too large or too small, the output voltage signal will be cut off or truncated, resulting in signal distortion.

Figure 1:
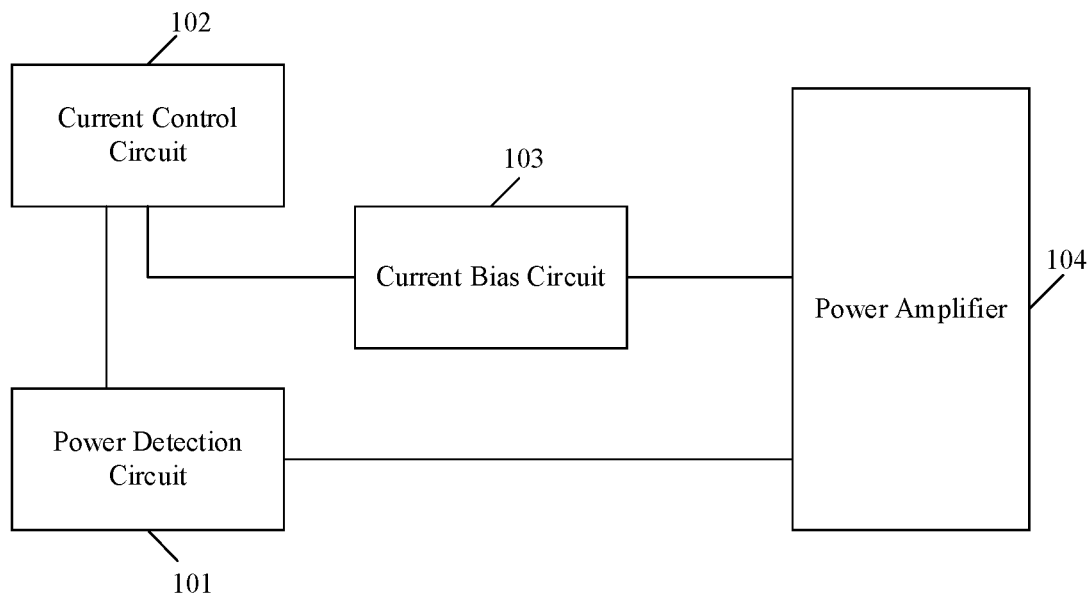
FIG. 1 is a flowchart diagram of a compensation circuit provided by some embodiments of the disclosure.
Figure 4:
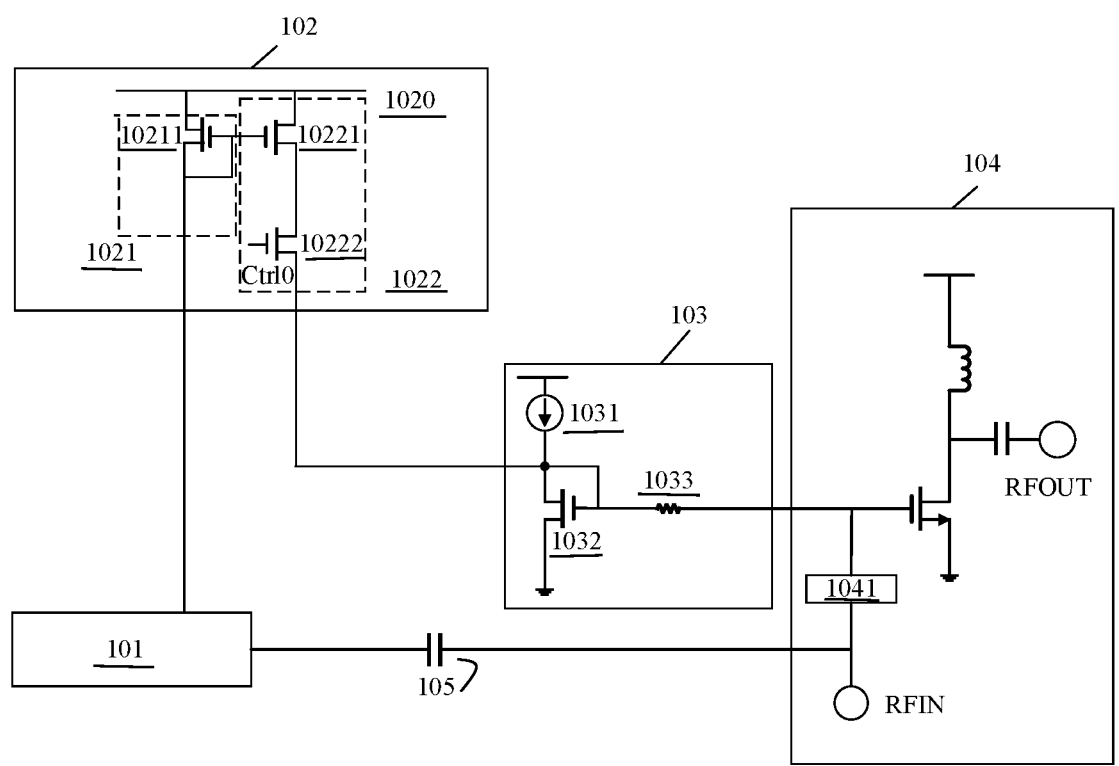
FIG. 4 is a schematic diagram of a specific structure of a compensation circuit provided by some embodiments of the disclosure.
Figure 5:
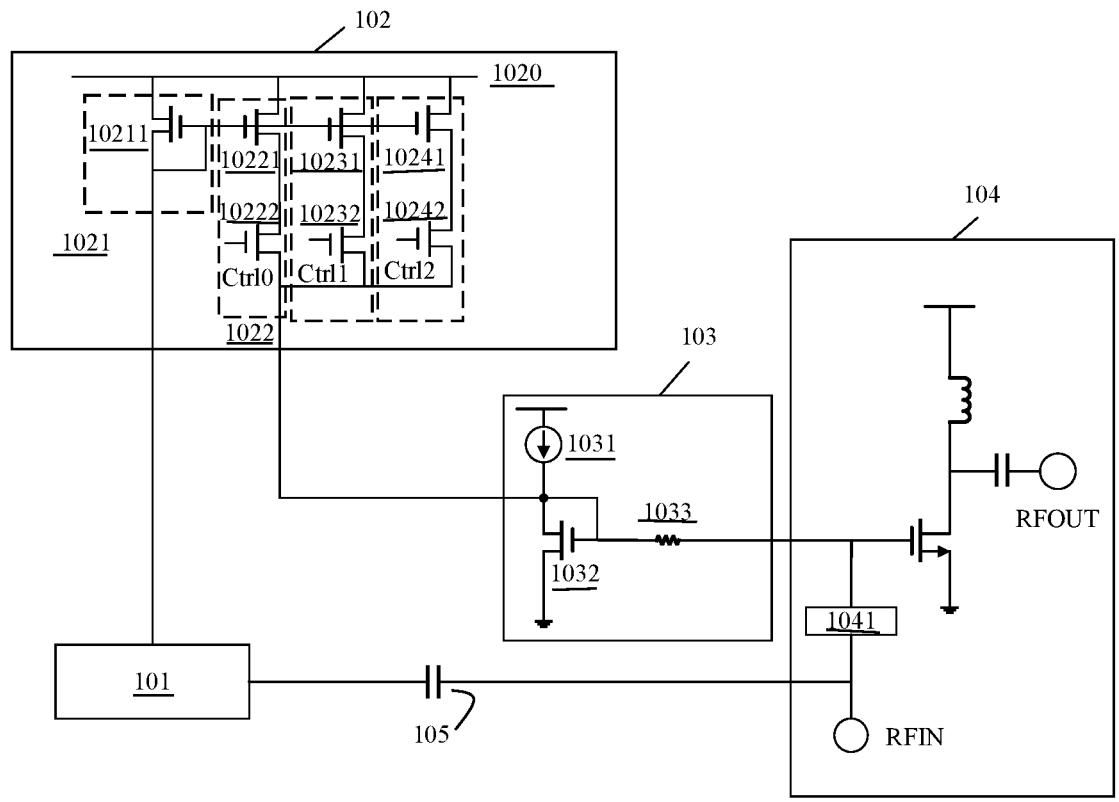
FIG. 5 is a schematic diagram of another specific structure of a compensation circuit provided by some embodiments of the disclosure.
Figure 6:
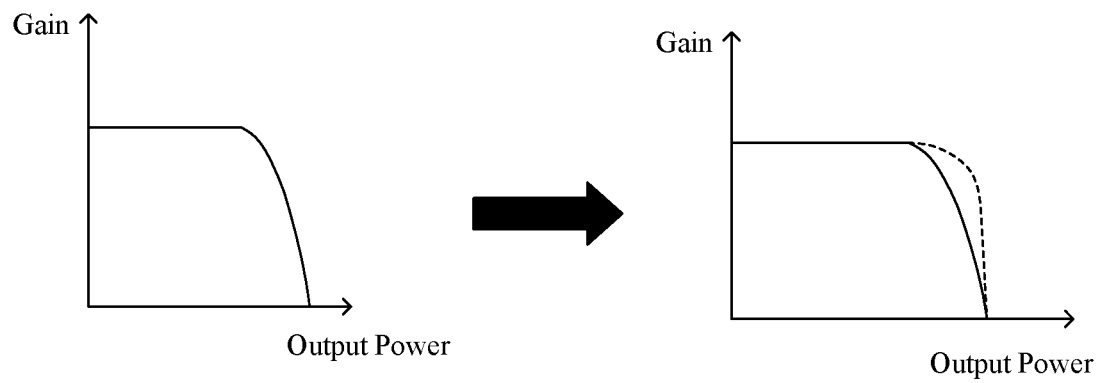
FIG. 6 is a schematic diagram of a gain result of the compensation circuit provided by some embodiments of the disclosure.

In some embodiments of the disclosure, FIG. 1 is a flowchart diagram of a compensation circuit provided by some embodiments of the disclosure. Referring to FIG. 1, the compensation circuit includes: a power amplifier 104, a current bias circuit 103, a power detection circuit 101 and a current control circuit 102. FIG. 4 is a schematic diagram of a specific structure of the compensation circuit provided by some embodiments of the disclosure, and FIG. 5 is a schematic diagram of another specific structure of the compensation circuit provided by some embodiments of the disclosure. Referring to FIG. 4 and FIG. 5, the power detection circuit 101, connected with the power amplifier 104, is configured to detect the voltage amplitude of the radio frequency input signal of the power amplifier 104 and output a reference current when the voltage amplitude of the radio frequency input signal meets a preset condition;

the current control circuit 102, connected with the power detection circuit 101 and the current bias circuit 103, is configured to receive the reference current output by the power detection circuit 101 and output the compensation current to the current bias circuit 103 based on the reference current;

the current bias circuit 103, connected with the current control circuit 102 and the power amplifier 104, is configured to receive the compensation current output by the current control circuit 102 and generate a direct-current bias current, and output the compensation current and the direct-current bias current to the power amplifier 104; and the power amplifier 104, connected with the current bias circuit 103, is configured to receive the compensation current and the direct-current bias current, and amplify the power of the radio frequency input signal based on the compensation current and the direct-current bias current.

Specifically, in some embodiments, the power amplifier 104 may be a triode power amplifier or a MOSFET power amplifier, which is not specifically limited herein.

It should be noted that the operation state of the power amplifier include an amplification state, a cut-off state, a saturation state and the like. When the power amplifier is in the amplification state, the radio frequency output signal obtained by the radio frequency input signal passing through the power amplifier is linearly amplified; when the power amplifier is in the cut-off state, the power amplifier does not work, and at this time, the radio frequency input signal cannot pass through the power amplifier; and when the power amplifier is in the saturation state, the radio frequency output signal obtained by the radio frequency input signal passing through the power amplifier will be compressed, so that the radio frequency input signal and the radio frequency output signal cannot be completely linearly amplified, and the radio frequency output signal will be truncated, i.e., AM-AM distortion.

Specifically, the power detection circuit 101 may be a processing module or a processor, which can obtain the voltage amplitude of the radio frequency input signal of the power amplifier 104 in real time. The power detection circuit 101 monitors the voltage amplitude of the radio frequency input signal of the power amplifier 104 in real time, and the direct-current bias voltage formed by the power detection circuit 101 is unchanged in the case that the set direct-current bias current is unchanged; and when the voltage amplitude of the radio frequency input signal meets the preset conditions, a reference current is output for the current control circuit 102 to output the compensation current to the current bias circuit 103 based on the reference current, and finally combined with the radio frequency input signal so that the radio frequency input signal reaches the input voltage condition in the amplification state of the power amplifier under the action of the direct-current bias current generated by the compensation circuit and the current bias circuit 103, and is power amplified by the power amplifier.

Exemplary, the preset condition include that the power detection circuit detects that the voltage amplitude of the radio frequency input signal is greater than a saturation voltage of the power amplifier.

Specifically, in one embodiment, the power amplifier 104 is a MOSFET transistor, and the saturation voltage is a demarcation point that distinguishes linear amplification and nonlinear amplification of MOS devices. When the voltage of the radio frequency output signal is still greater than the saturation voltage of the power amplifier 104 under the action of the direct-current bias current, the operation state of the power amplifier 104 will enter the saturation state, at this time, the voltage of the input signal is larger, but the voltage of the output signal is basically constant; here the amplification characteristics of the power amplifier 104 will present a nonlinear amplification state.

Specifically, the direct-current bias voltage may be expressed as Vb, the voltage of the radio frequency input signal may be expressed as Vin. When the power detection circuit detects that the voltage Vin+Vb of the radio frequency output signal is greater than the saturation voltage of the power amplifier, a reference current is output for the current control circuit 102 to output the compensation current based on the reference current. The compensation current is configured to adjust the radio frequency input signal so that the radio frequency input signal in combination with the direct-current bias voltage can meet the voltage range of the power amplifier 104 in the amplification state, and the linear amplification of the radio frequency input signal by the power amplifier 104 is realized.

Exemplary, the preset condition further includes that the power detection circuit detects that the voltage amplitude of the radio frequency input signal is lower than a turn-on voltage of the power amplifier.

Specifically, the turn-on voltage is a demarcation point for distinguishing the turn-on and the turn-off of the MOS device. When the voltage of the radio frequency output signal is still lower than the turn-on voltage of the power amplifier 104 under the action of the direct-current bias current Vb, the operation state of the power amplifier 104 will enter the cut-off state, that is, a non-working state; at this time, the output current of the output signal of the power amplifier is small, approximately equal to 0; here, the output signal of the power amplifier 104 presents a cut-off state, and the power amplifier 104 will present a nonlinear amplification state.

Specifically, when the power detection circuit detects that the voltage Vin+Vb of the radio frequency output signal is lower than the turn-on voltage of the power amplifier, a reference current is output for the current control circuit 102 to output the compensation current based on the reference current. The compensation current is configured to adjust the radio frequency input signal so that the radio frequency input signal in combination with the direct-current bias voltage can meet the turn-on voltage of the power amplifier 104, and thus the power amplifier 104 enters the operation state and linearly amplifies the radio frequency input signal.

It should be noted that, in some embodiments of the disclosure, the voltage amplitude of the radio frequency input signal of the power amplifier is detected through the power detection circuit, when the voltage amplitude of the radio frequency input signal meets the preset condition, a reference current is output, and the value of the generated reference current corresponds to the voltage amplitude of the radio frequency input signal; the current control circuit, according to the reference current output by the power detection circuit, outputs the compensation current to the current bias circuit, and the compensation current is dynamically adjusted according to the reference current. Compared with some implementations, which can only provide a single fixed direct-current bias current, the compensation current can be further adjusted according to the power of the input signal of the power amplifier. Without changing the power consumption of the signal back-off section of the power amplifier, the compensation current of the power amplifier is generated by the power detection circuit and the current control circuit so as to realize the compensation of AM-AM distortion, so that the power amplifier can amplify the signal more stably with reduced distortion.

In some embodiments, the current control circuit includes a first branch and at least one second branch; the first branch, connected with the output end of the power detection circuit, is configured to receive the reference current output by the power detection circuit; the second branch, respectively connected to the first branch and the current bias circuit, is configured to form a current mirror with the first branch to output the compensation current based on the reference current received by the first branch.

Figure 2:
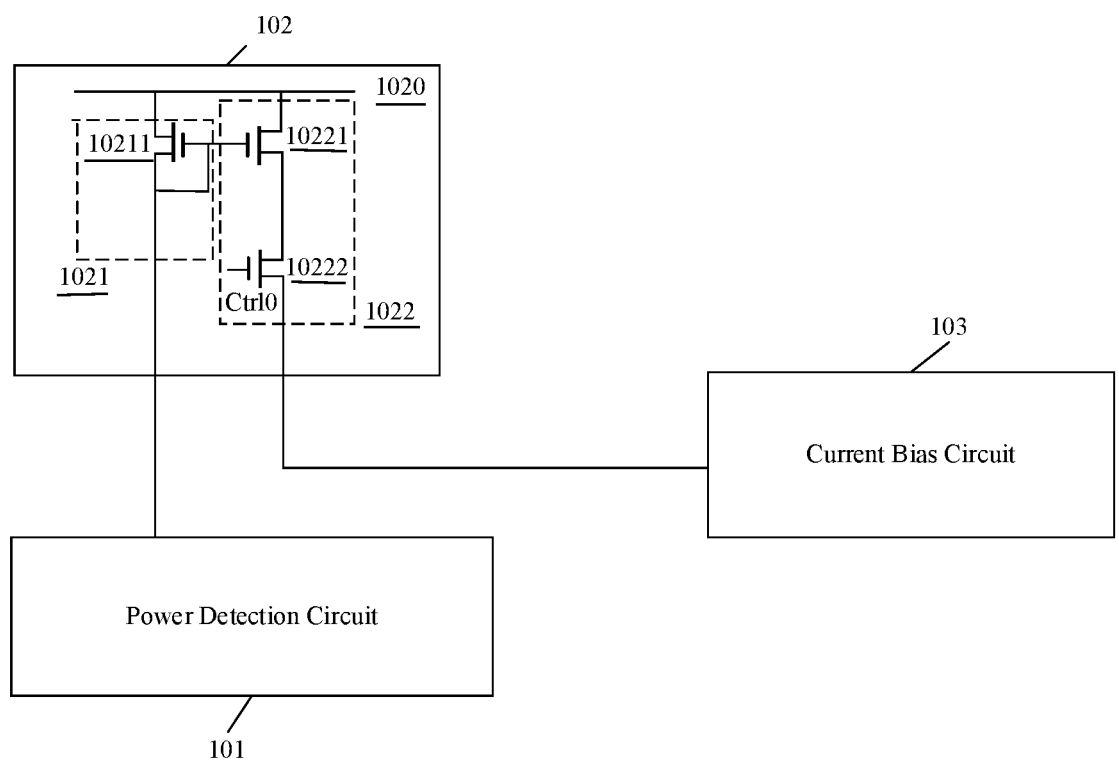
FIG. 2 is a schematic diagram of a specific structure of a current control circuit provided by some embodiments of the disclosure.

In some embodiments, FIG. 2 is a schematic diagram of a specific structure of the current control circuit provided by some embodiments of the disclosure. Referring to FIG. 2, the first branch 1021 includes the first transistor 10211; the source of the first transistor 10211 is connected to the first power supply 1020; the gate of the first transistor 10211 is connected to the second branch, and the drain of the first transistor 10211 is shorted with the gate of the first transistor 10211; the drain of the first transistor 10211 is connected to the output end of the power detection circuit 101 and configured to receive the reference current output by the power detection circuit 101.

Specifically, the first transistor is a MOS transistor, herein the drain of the first transistor 10211 is shorted with the gate thereof, and here, the first transistor 10211 serves as a diode configured to separate the voltage at the first power supply and the power detection circuit terminal.

In some embodiments, in some embodiments, the at least one second branch may be one second branch; and the second branch includes a second transistor 10221 and a third transistor 10222; in which the source of the second transistor 10221 is connected to the first power supply 1020; the gate of the second transistor 10221 is connected to the gate of the first transistor 10211; the drain of the second transistor 10221 is connected to the source of the third transistor 10222, which is configured to generate the compensation current based on the reference current and output it to the third transistor 10222; the drain of the third transistor 10222, connected to the input end of the current bias circuit 103, is configured to output the compensation current to the current bias circuit 103; and the gate of the third transistor 10222 is a control terminal configured to receive a digital signal to control the on-off state of the second branch.

Specifically, the second transistor 10221 and the first transistor 10211 form a current mirror, in which a geometric proportional current mirror is formed depending the width-length ratio of the second transistor 10221 and the first transistor 10211; the ratio of the current on the second branch 1022 to the current on the first branch 1021 is equal to the width-length ratio of the second transistor 10221 to the first transistor 10211; the current on the second branch can be changed according to the change of the width-length ratio between the second transistor 10221 of the second branch and the first transistor 10211.

The gate Ctrol0 of the third transistor 10222 receives a digital signal, and when a high level is received, it is in an open-state such that the second branch 1022 is connected;

and when a low level is received, it is in an off-state, the third transistor is disconnected, and the second branch 1022 is disconnected.

Figure 3:
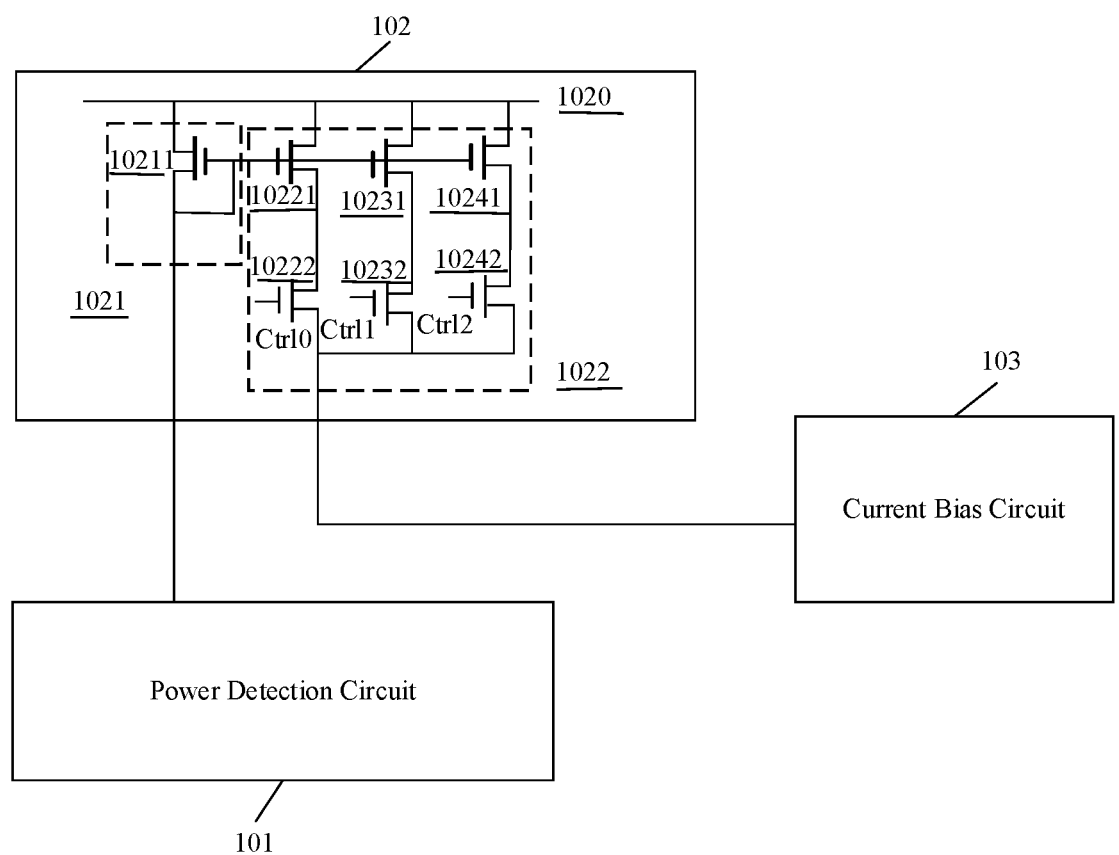
FIG. 3 is a schematic diagram of another specific structure of a current control circuit provided by some embodiments of the disclosure.

It should be noted that, in other embodiments, the at least one second branch may be two or more second branches. FIG. 3 is a schematic diagram of another specific structure of the current control circuit provided by some embodiments of the disclosure. Referring to FIG. 3, the second branch includes a second transistor 10221 and a third transistor 10222; a fifth transistor 10231 and a sixth transistor 10232; a seventh transistor 10241 and an eighth transistor 10242; in which the respective sources of the second transistor 10221, the fifth transistor 10231 and the seventh transistor 10241 are connected to the first power supply 1020; and the respective gates of the second transistor 10221, the fifth transistor 10231 and the seventh transistor 10241 are connected to the gate of the first transistor 10211 to form a cascode current mirror.

The drain of the second transistor 10221 is connected to the source of the third transistor 10222, the drain of the fifth transistor 10231 is connected to the source of the sixth transistor 10232, and the drain of the seventh transistor 10241 is connected to the source of the eighth transistor 10242; the second transistor 10221, the fifth transistor 10231, and the seventh transistor 10241 are respectively configured to generate the compensation current based on the reference current; and the gate Ctrl0 of the third transistor 10222, the gate Ctrl1 of the sixth transistor 10232 and the gate Ctrl2 of the eighth transistor 10242 are control terminals, respectively, to control the on-off state of the branch based on the level of the received digital signal.

The drain of the third transistor 10222, the drain of the sixth transistor 10232 and the drain of the eighth transistor 10242 are respectively connected to the input end of the current bias circuit 103, and configured to output the compensation current to the current bias circuit 103.

In some embodiments, the current bias circuit 103 includes a current source 1031 and a fourth transistor 1032; in which the current source 1031 is configured to generate the direct-current bias current and output it to the fourth transistor 1032; the source of the fourth transistor 1032 is connected to the drain of the third transistor 10222 and the current source 1031; the gate of the fourth transistor 1032 is shorted with the source thereof; the drain of the fourth transistor 1032 is connected to the ground terminal; and the fourth transistor 1032 is configured to receive the compensation current and the direct-current bias current and output the compensation current and the direct-current bias current to the power amplifier.

Specifically, the current source, i.e., an ideal current source, is a model abstracted from an actual power supply. Its end buttons can always provide a certain current to the outside regardless of the voltage at both ends. The current source has two basic properties: first, the current it provides is a constant value I or a certain time function I (t) and is not depend on the voltage at both ends; second, the current of the current source itself is determined, while the voltage at both ends is arbitrary. Here, the current source 1031 is configured to generate a constant current to serve as the direct-current bias current of the power amplifier 104.

The gate of the forth transistor 1032 is shorted with the source of the forth transistor 1032 to form a diode to prevent the radio frequency input signal from affecting the bias current and the compensation current.

Specifically, according to the reference current, the compensation current can be controlled by dynamically adjusting the digital signals on each branch of the second branch 1022; the constant direct-current bias current generated by the current source 1031 together with the compensation current regulates the voltage at the input end of the radio frequency input signal of the power amplifier 104, so that the operation state of the power amplifier 104 remains in the amplification state, and the AM-AM distortion is compensated without changing the power consumption of the signal back-off section of the power amplifier, so that the power amplifier can more stably amplify the signal with reduced distortion.

In some embodiments, the current bias circuit 103 further includes a resistor 1033, in which the input end of the resistor 1033 is connected to the gate of the fourth transistor 1032; and the output end of the resistor 1033 is connected to the power amplifier 104.

Specifically, the resistor 1033 receives the compensation current generated by the current control circuit 102 and the direct-current bias current generated by the current bias circuit 103, and the voltage at the output end of the resistor 1033 is the product of the resistance value of the resistor 1033 and the sum of the compensation current and the direct-current bias current.

Specifically, in some embodiments of the disclosure, the width-length ratios of the respective second transistor 10221, the fifth transistor 10231 and seventh transistor 10241 to the first transistor 10211 in the second branch may be same, or different. According to the magnitude of the reference current output by the power detection circuit 101, the state of the electrical level of the digital signal at the gate Ctrl0 of the third transistor 10222, the gate Ctrl1 of the sixth transistor 10232 and the gate Ctrol2 of the eighth transistor 10242 is adjusted, resulting in different magnitudes of the compensation current generated by the current control circuit 102, therefore, after passing through the resistor 1033, the voltage at the input end of the resistor 1033 is also different, and the voltage at the input end of the resistor 1033 is dynamically adjusted according to the voltage of the radio frequency input signal, so that the operation state of the power amplifier 104 is kept in the amplification state.

In some embodiments, the power amplifier 104 includes a matching circuit 1041 which is connected to the resistor 1033 and the input end RFIN of the radio frequency input signal.

Specifically, the matching circuit is arranged on the input end of the transmission line, so as to achieve the purpose that all high-frequency microwave signals can be transmitted to the load point, and almost no signal is reflected back to the source point, thereby improving energy efficiency.

In some embodiments, the compensation circuit further includes a capacitor 105; the capacitor 105 is connected between the input end of the power detection circuit 101 and the input end RFIN of the radio frequency input signal.

Specifically, the capacitor 105, conducting an alternating current and blocking a direct current, is configured to prevent the reference current from adversely flowing to affect the radio frequency input signal.

FIG. 4 is a schematic diagram of a specific structure of a compensation circuit based on the current control circuit described in some embodiments shown in FIG. 2. FIG. 5 is a schematic diagram of another specific structure of the compensation circuit based on the current control circuit described in some embodiments shown in FIG. 3.

In some embodiments provided in the disclosure, it should be understood that the disclosed apparatus circuit and method may be implemented in other ways. The above-described embodiments of device are merely illustrative, for example, the division of the units is only a division based on logical functions, and there may be other divisions in actual implementations, e.g., multiple units or components may be combined, or may be integrated into another system, or some features may be ignored or may not be performed. In addition, the coupling, direct coupling or communication connection between the components illustrated or discussed may be indirect coupling or communication connection through some interfaces, devices or units, which may be electrical, mechanical or otherwise.

The above-mentioned units illustrated as separate components may be or may not be physically separated, and the components illustrated as units may be or may not be physical units, i.e., they may be located in one place or distributed to multiple network units; some or all of the units may be selected according to actual needs to achieve the purpose of the solutions of the embodiments.

In addition, each functional unit in each of the embodiments of the disclosure may be integrated into a processing unit, and each unit may also be used separately as a single unit, and two or more units may also be integrated into a single unit; the above integrated units may be realized either in the form of hardware or in the form of hardware together with software functional units.

Those ordinarily skilled in the art may understand that all or a part of the steps for realizing the above-mentioned embodiments of the method may be realized by hardware related to program instructions, and the above-mentioned program may be stored in a computer readable storage medium, and when the program is executed, the steps including the above-mentioned embodiments of the method are executed; and the above-mentioned storage medium includes various medium that may store program codes, such as mobile storage devices, Read-Only Memory (ROM), Random Access Memory (RAM), magnetic disks or optical disks, etc.

Or, the above integrated unit in some embodiments of the disclosure may also be stored in a computer-readable storage medium, when it is implemented as a software function module and sold or used as an individual product. Based on such understanding, the technical solutions of the embodiments of the disclosure substantially or the part contributing to some implementations may be embodied in the form of a software product, and the computer software product is stored in a storage medium and includes several instructions to allow an electronic device (which may be a personal computer, a server, or a network equipment, etc.) to execute all or part of the method described in each of the embodiments of the disclosure. And the aforementioned storage medium includes various medium that may store program codes, such as mobile storage devices, ROM, RAM, magnetic disks or optical disks etc.

Various embodiments of the present disclosure can have one or more of the following advantages.

The compensation circuit provided in the embodiments of the disclosure detects the voltage amplitude of the radio frequency input signal of the power amplifier through the power detection circuit, and outputs a reference current when the voltage amplitude of the radio frequency input signal meets a preset condition, generating a corresponding reference current according to the voltage amplitude of the radio frequency input signal; the current controls the circuit to output the compensation current to the current bias circuit according to the reference current output by the power detection circuit, and dynamically adjust the compensation current according to the reference current. Compared with some implementations, in which only a single fixed direct-current bias current can be provided, with the compensation circuit of the disclosure, the magnitude of the compensation current can be further adjusted according to the power of the input signal of the power amplifier, and the power detection circuit and the current control circuit are applied to generate the compensation current of the power amplifier to realize the compensation of Am-Am distortion without changing the power consumption of the signal back-off section of the power amplifier, so that the power amplifier can amplify the signal more stably and meanwhile reduce the distortion.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

What is claimed is:

1. A compensation circuit, comprising a power amplifier, a current bias circuit, a power detection circuit, and a current control circuit; wherein the power detection circuit, connected with the power amplifier, is configured to detect a voltage amplitude of a radio frequency input signal of the power amplifier and output a reference current when a voltage amplitude of the radio frequency input signal meets a preset condition;

the current control circuit, connected with the power detection circuit and the current bias circuit, is configured to receive the reference current output by the power detection circuit and output a compensation current to the current bias circuit based on the reference current;

the current bias circuit, connected with the current control circuit and the power amplifier, is configured to receive the compensation current output by the current control circuit and generate a direct-current bias current, and output the compensation current and the direct-current bias current to the power amplifier; and the power amplifier, connected with the current bias circuit, is configured to receive the compensation current and the direct-current bias current, and amplify a power of the radio frequency input signal based on the compensation current and the direct-current bias current;

wherein the current control circuit comprises a first branch and at least one second branch;

the first branch, connected with an output end of the power detection circuit, is configured to receive the reference current output by the power detection circuit; and the second branch, connected to the first branch and the current bias circuit, is configured to form a current mirror with the first branch to output the compensation current based on the reference current received by the first branch;

wherein the first branch comprises a first transistor;

a source of the first transistor is connected with a first power supply;

a gate of the first transistor is connected with the second branch, and a drain of the first transistor is shorted with the gate of the first transistor; and the drain of the first transistor, connected with the output end of the power detection circuit, is configured to receive the reference current output by the power detection circuit.

2. The compensation circuit of claim 1, wherein the preset condition comprises:
the power detection circuit detects that the voltage amplitude of the radio frequency input signal is greater than a saturation voltage of the power amplifier.

3. The compensation circuit of claim 2, wherein the preset condition further comprises:
the power detection circuit detects that the voltage amplitude of the radio frequency input signal is lower than a turn-on voltage of the power amplifier.

4. A compensation circuit, comprising a power amplifier, a current bias circuit, a power detection circuit, and a current control circuit; wherein
the power detection circuit, connected with the power amplifier, is configured to detect a voltage amplitude of a radio frequency input signal of the power amplifier and output a reference current when a voltage amplitude of the radio frequency input signal meets a preset condition;
the current control circuit, connected with the power detection circuit and the current bias circuit, is configured to receive the reference current output by the power detection circuit and output a compensation current to the current bias circuit based on the reference current;
the current bias circuit, connected with the current control circuit and the power amplifier, is configured to receive the compensation current output by the current control circuit and generate a direct-current bias current, and output the compensation current and the direct-current bias current to the power amplifier; and
the power amplifier, connected with the current bias circuit, is configured to receive the compensation current and the direct-current bias current, and amplify a power of the radio frequency input signal based on the compensation current and the direct-current bias current;
wherein the current control circuit comprises a first branch and at least one second branch;
the first branch, connected with an output end of the power detection circuit, is configured to receive the reference current output by the power detection circuit; and
the second branch, connected to the first branch and the current bias circuit, is configured to form a current mirror with the first branch to output the compensation current based on the reference current received by the first branch;
wherein the first branch comprises a first transistor;
wherein the second branch comprises a second transistor and a third transistor;
a source of the second transistor is connected with a first power supply; a gate of the second transistor is connected with a gate of the first transistor; a drain of the second transistor connected with a source of the third transistor, is configured to generate the compensation current based on the reference current and output it to the third transistor;
a drain of the third transistor, connected with an input end of the current bias circuit, is configured to output the compensation current to the current bias circuit; and
a gate of the third transistor is a control terminal configured to receive a digital signal to control an on-off state of the second branch.

5. The compensation circuit of claim 4, wherein the current bias circuit comprises a current source and a fourth transistor;
the current source is configured to generate the direct-current bias current and output it to the fourth transistor;
a source of the fourth transistor is connected with the drain of the third transistor and the current source;
a gate of the fourth transistor is shorted with the source of the fourth transistor;
a drain of the fourth transistor is connected to the ground; and
the fourth transistor is configured to receive the compensation current and the direct-current bias current, and output the compensation current and the direct-current bias current to the power amplifier.

6. The compensation circuit of claim 5, wherein the current bias circuit further comprises a resistor;
an input end of the resistor is connected to the gate of the fourth transistor; and
an output end of the resistor is connected to the power amplifier.

7. The compensation circuit of claim 6, wherein the power amplifier comprises a matching circuit; and
the matching circuit is connected to the resistor and the input end of the radio frequency input signal.

8. The compensation circuit of claim 1, further comprising a capacitor; wherein
the capacitor is connected between the input end of the power detection circuit and the input end of the radio frequency input signal.

9. The compensation circuit of claim 1, wherein
the compensation circuit is configured to dynamically adjust the compensation current according to the reference current, such that the magnitude of the compensation current is further adjusted according to the power of the radio frequency input signal of the power amplifier; and
the power detection circuit and the current control circuit are applied to generate the compensation current of the power amplifier to realize compensation of Am-Am distortion without changing power consumption of a signal back-off section of the power amplifier.

* * * * *